US011869763B2

(12) United States Patent
Ahn et al.

(10) Patent No.: US 11,869,763 B2
(45) Date of Patent: Jan. 9, 2024

(54) APPARATUS AND SYSTEM FOR TREATING SUBSTRATE

(71) Applicant: SEMES CO., LTD., Cheonan-si (KR)

(72) Inventors: Jun Keon Ahn, Sejong-si (KR); Soo Young Park, Incheon (KR); Ohyeol Kwon, Cheonan-si (KR); Jung Hwan Lee, Pyeongtaek-si (KR); Seungtae Yang, Yongin-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 418 days.

(21) Appl. No.: 16/861,387

(22) Filed: Apr. 29, 2020

(65) Prior Publication Data
US 2020/0350156 A1    Nov. 5, 2020

(30) Foreign Application Priority Data

Apr. 30, 2019   (KR) .................. 10-2019-0050434

(51) Int. Cl.
*H01L 21/02* (2006.01)
*B23K 26/40* (2014.01)
(Continued)

(52) U.S. Cl.
CPC ...... *H01L 21/02098* (2013.01); *B08B 7/0042* (2013.01); *B23K 26/0604* (2013.01);
(Continued)

(58) Field of Classification Search
CPC ........ H01L 21/02098; H01L 21/02087; H01L 21/67115; H01L 21/68764;
(Continued)

(56) References Cited

U.S. PATENT DOCUMENTS 4,532,401 A * 7/1985 Shiozaki ............ B23K 26/1224
                                                              219/121.84
5,751,436 A *  5/1998 Kwon ..................... H04N 1/10
                                                               219/121.68
(Continued)

FOREIGN PATENT DOCUMENTS

CN         1550283 A        12/2004
CN      102299201 A         12/2011
(Continued)

OTHER PUBLICATIONS

Chinese Office Action dated Aug. 9, 2022 for corresponding Chinese Application No. 202010363048.4.
(Continued)

*Primary Examiner* — Geoffrey S Evans
(74) *Attorney, Agent, or Firm* — Harness, Dickey & Pierce, P.L.C.

(57) ABSTRACT

An apparatus and system for treating a substrate includes a chamber having an inner space, a support unit in the inner space and configured to support and rotate the substrate, and first and second laser irradiation unit configured to irradiate first and second laser beams onto the substrate. The first laser irradiation unit includes a first laser light source configured to generate the first laser beam, and a first wavelength adjusting member configured to adjust a range of a wavelength of the first laser beam received from the first laser light source. The second laser beam, and a second wavelength adjusting member configured to adjust a range of a wavelength of the second laser beam received from the second laser light source.

14 Claims, 9 Drawing Sheets

(51) Int. Cl.
*H01L 21/67* (2006.01)
*H01L 21/687* (2006.01)
*B08B 7/00* (2006.01)
*B23K 26/08* (2014.01)
*B23K 26/0622* (2014.01)
*B23K 26/073* (2006.01)
*B23K 26/06* (2014.01)
*B23K 26/082* (2014.01)
*B23K 101/40* (2006.01)

(52) U.S. Cl.
CPC ...... *B23K 26/0622* (2015.10); *B23K 26/0648* (2013.01); *B23K 26/0665* (2013.01); *B23K 26/073* (2013.01); *B23K 26/082* (2015.10); *B23K 26/0823* (2013.01); *H01L 21/02087* (2013.01); *H01L 21/67115* (2013.01); *H01L 21/68764* (2013.01); *B23K 2101/40* (2018.08)

(58) Field of Classification Search
CPC .............. B23K 26/0622; B23K 26/082; B23K 26/0604; B23K 26/0648; B23K 26/0655; B23K 26/073; B23K 26/0823; B23K 2101/40; B08B 7/0042
USPC ............ 219/121.77, 121.73, 121.72, 121.76; 438/689
See application file for complete search history.

(56) References Cited

U.S. PATENT DOCUMENTS

| | | | | |
|---|---|---|---|---|
| 6,540,952 | B2* | 4/2003 | LaPoint | B23K 26/361 219/121.85 |
| 8,410,394 | B2* | 4/2013 | Millman, Jr | B23K 26/0622 219/121.76 |
| 10,068,765 | B2* | 9/2018 | Liu | H01L 21/02348 |
| 2003/0080100 | A1* | 5/2003 | Yamazaki | B23K 26/0823 219/121.77 |
| 2003/0136772 | A1* | 7/2003 | Yamazaki | H01L 21/02532 219/121.73 |
| 2003/0153182 | A1* | 8/2003 | Yamazaki | H01L 21/76894 438/689 |
| 2011/0139759 | A1* | 6/2011 | Millman, Jr | B23K 26/0823 219/121.72 |
| 2013/0334186 | A1* | 12/2013 | Nomaru | B23K 26/02 219/121.82 |
| 2017/0120380 | A1 | 5/2017 | Zhang et al. | |
| 2017/0247797 | A1* | 8/2017 | Zhou | F01D 5/005 |
| 2017/0304951 | A1* | 10/2017 | Lee | B23K 26/355 |
| 2020/0353563 | A1* | 11/2020 | Matsuo | B23K 26/082 |
| 2021/0296119 | A1* | 9/2021 | Tanoue | H01L 21/304 |

FOREIGN PATENT DOCUMENTS

| | | | | |
|---|---|---|---|---|
| CN | 103537811 A | 1/2014 | | |
| DE | 102014207728 A1 | 10/2015 | | |
| JP | 2004526335 A | 8/2004 | | |
| JP | 2009038295 A | 2/2009 | | |
| JP | 2010172959 A | 8/2010 | | |
| JP | 2014-504004 A | 2/2014 | | |
| JP | 2018015783 A * | 2/2018 | ......... | B23K 26/0006 |
| KR | 10-2004-0092428 A | 11/2004 | | |
| KR | 2004-0092428 A | 11/2004 | | |
| KR | 10-2011-0059724 A | 6/2011 | | |
| KR | 2011-0059724 A | 6/2011 | | |
| KR | 101557586 B1 | 10/2015 | | |
| KR | 20150141140 A | 12/2015 | | |
| KR | 20180129641 A | 12/2018 | | |
| KR | 20190007776 A | 1/2019 | | |
| WO | WO-2018110415 A1 * | 6/2018 | ......... | B23K 26/067 |
| WO | WO-2018/145001 A1 | 8/2018 | | |

OTHER PUBLICATIONS

Japanese Office Action dated Oct. 25, 2022 for corresponding Japanese Application No. 2020-078952.
Office Action for Korean Application No. 10-2019-0050434 dated Nov. 26, 2020.

* cited by examiner

APPARATUS AND SYSTEM FOR TREATING SUBSTRATE

CROSS-REFERENCE TO RELATED APPLICATIONS

A claim for priority under 35 U.S.C. § 119 is made to Korean Patent Application No. 10-2019-0050434 filed on Apr. 30, 2019 in the Korean Intellectual Property Office, the entire contents of which are hereby incorporated by reference.

BACKGROUND

Embodiments of the inventive concept described herein relate to a substrate treating method, a substrate treating apparatus, and a substrate treating system.

Various processes such as application, photographing, deposition, ashing, etching, and ion implantation are performed during treating of a glass panel such as that used for manufacturing a substrate, for example, a semiconductor wafer or a flat panel display. As the process for treating the substrate is performed, a cured thin-film is coated or deposited on a surface of the substrate. Further, an edge bead removing process is required to increase a production yield at an edge of the substrate. The edge bead removing process removes an unwanted thin-film and an attached byproduct polymer from the edge region of the substrate.

FIG. 1 is a view showing performing an edge bead removing process in a conventional substrate treating apparatus. Referring to FIG. 1, the conventional substrate treating apparatus 1 has a rotary chuck 2 and a nozzle 4. The rotary chuck 2 supports and rotates a substrate W. The nozzle 4 sprays chemical C on an edge region of the substrate W. Each nozzle 4 is disposed above and below the substrate W to spray the chemical C on top and bottom surfaces of the substrate W. The sprayed chemical C removes a thin-film F disposed on the edge region of the substrate W. However, when the edge bead removing process is performed by spraying the chemical C, the removal of the thin-film F in the edge region of the substrate W is not properly performed. For example, as shown in FIG. 2, the thin-film F in the edge region of the substrate W may be removed obliquely downwards outwardly in a radial direction of the substrate W. This is because the liquid chemical C is supplied while the substrate W is rotated. When the removal of the thin-film F in the edge region of the substrate W is not performed properly, a yield of a production process is reduced. Moreover, there is a risk of additional contamination due to formation of a pin mark on a surface of the substrate W after the removal process.

SUMMARY

Embodiments of the inventive concept provide a substrate treating method, a substrate treating apparatus, and a substrate treating system in which a film is removed from a substrate at high efficiency.

Moreover, embodiments of the inventive concept provide a substrate treating method, a substrate treating apparatus, and a substrate treating system in which a film removing efficiency increases by irradiating a plurality of unit pulse laser beams onto a film on a substrate.

Moreover, embodiments of the inventive concept provide a substrate treating method, a substrate treating apparatus, and a substrate treating system in which a film removed region is minimized by irradiating a plurality of unit pulse laser beams onto a film on a substrate.

Moreover, embodiments of the inventive concept provide a substrate treating method, a substrate treating apparatus, and a substrate treating system in which a wavelength of a laser beam to be irradiated is varied depending on a type of a film to maximize efficiency of film removal.

The purposes of the inventive concept are not limited thereto. Other purposes as not mentioned will be clearly understood by those skilled in the art from following descriptions.

According to an exemplary embodiment, a method for treating a substrate includes a first treating operation for treating an edge region of the substrate by irradiating a first laser beam having a first wavelength to the edge region of a rotating substrate, and a second treating operation for treating the edge region by irradiating a second laser beam of a second wavelength to the edge region of the rotating substrate, wherein the first wavelength and the second wavelength are different from each other.

The treating of the substrate may include removing the film from the substrate, wherein the film may include a first film, and a second film different from the first film, wherein the first film and the second film may be vertically sequentially stacked on the substrate. When removing the first film, the first treating operation may be performed. When removing the second film, the second treating operation may be performed.

The first treating operation and the second treating operation may be performed sequentially.

Each of the first wavelength and the second wavelength may be in a range of 150 nm to 1200 nm.

The first wavelength may be present in one range selected from a first range of 750 nm to 1200 nm, a second range of 380 nm to 749 nm, a third range 300 nm to 379 nm, and a fourth range of 150 nm to 299 nm. The second wavelength may be present in another range selected from the first range, the second range, the third range, and the fourth range.

Each of the first laser beam and the second laser beam may include a plurality of unit pulse laser beams.

Each of the first laser beam and the second laser beam may be irradiated to a top surface and/or a bottom face of the edge region of the substrate.

The first treating operation and the second treating operation may be performed in the same chamber.

The first treating operation and the second treating operation may be performed in different chambers.

According to an exemplary embodiment, an apparatus for treating a substrate includes a chamber having an inner space, a support unit received in the inner space for supporting and rotating the substrate, a first laser irradiation unit for irradiating a first laser beam having a first wavelength to the substrate supported on the support unit, a second laser irradiation unit for irradiating a second laser beam having a second wavelength to the substrate supported on the support unit, and a controller to control the first laser irradiation unit, and the second laser irradiation unit. The controller may control the first laser irradiation unit and the second laser irradiation unit so that the first wavelength and the second wavelength are different from each other.

The controller may control the support unit. The controller may control the support unit to rotate the substrate supported on the support unit, control a combination of the support unit and the first laser irradiation unit to perform a first treating operation for irradiating the first laser beam to an edge region of the substrate supported on the support unit while the substrate is rotating, and control a combination of the support unit and the second laser irradiation unit to perform, after the first treating operation, a second treating operation for irradiating the second laser beam to the edge region of the substrate supported on the support unit while the substrate is rotating.

The controller may control a combination of the support unit, the first laser irradiation unit, and the second laser irradiation unit such that when removing a first film applied on the substrate supported on the support unit, the first treating operation is performed, such that when removing a second film applied on the substrate supported on the support unit, the second treating operation is performed.

The controller may control the first laser irradiation unit and the second laser irradiation unit so that each of the first laser beam and the second laser beam may include a plurality of unit pulse laser beams.

According to an exemplary embodiment, an apparatus for treating a substrate includes a chamber having an inner space, a support unit disposed in the inner space for supporting and rotating the substrate, a first laser irradiation unit for irradiating a first laser beam onto the substrate supported on the support unit, and a second laser irradiation unit for irradiating a second laser beam to the substrate supported on the support unit, wherein the first laser irradiation unit may include a first laser light source for generating the first laser beam, and a first wavelength adjusting member for adjusting a range of a wavelength of the first laser beam received from the first laser light source, wherein the second laser irradiation unit may include a second laser light source for generating the second laser beam, and a second wavelength adjusting member for adjusting a range of a wavelength of the second laser beam received from the second laser light source.

The apparatus may further include a controller to control the first laser irradiation unit and the second laser irradiation unit, wherein the controller may control the first laser irradiation unit and the second laser irradiation unit so that the first laser beam has a first wavelength and the second laser beam has a second wavelength different from the first wavelength.

The first laser irradiation unit may include a first laser irradiation member for irradiating the first laser beam received from the first laser light source to the substrate supported on the support unit, wherein the second laser irradiation unit may include a second laser irradiation member for irradiating the second laser beam received from the second laser light source to the substrate supported on the support unit, wherein the first laser irradiation member and the second laser irradiation member irradiate the first and second laser beams respectively while the first laser irradiation member and the second laser irradiation member are spaced apart from each other.

The controller may control the support unit. The controller may control the support unit to rotate the substrate supported on the support unit, control a combination of the support unit and the first laser irradiation unit to perform a first treating operation for irradiating the first laser beam to an edge region of the substrate supported on the support unit while the substrate is rotating, and control a combination of the support unit and the second laser irradiation unit to perform, after the first treating operation, a second treating operation for irradiating the second laser beam to the edge region of the substrate supported on the support unit while the substrate is rotating.

According to an exemplary embodiment, a system for treating a substrate includes a first chamber having a first inner space, a second chamber having a second inner space, wherein the second chamber is disposed independently of the first chamber, a transfer unit for transferring the substrate between the first chamber and the second chamber, a first laser irradiation unit for irradiating a plurality of first unit pulse laser beams to the substrate received in the first inner space, a second laser irradiation unit for irradiating a plurality of second unit pulse laser beams to the substrate received in the second inner space, and a controller configured to control the transfer unit, the first laser irradiation unit, and the second laser irradiation unit. The controller may control the first laser irradiation unit to perform a first treating operation for irradiating the first laser beam to the substrate received in the first inner space, control the transfer unit to perform a transfer operation for transferring the substrate subjected to the first treating operation from the first inner space to the second inner space, and control the second laser irradiation unit to perform a second treating operation for irradiating the second laser beam to the substrate transferred to the second inner space.

The controller may control the first laser irradiation unit and the second laser irradiation unit so that wavelengths of the first laser beam and the second laser beam are different from each other.

The controller may control the first laser irradiation unit and the second laser irradiation unit so that the wavelengths of the first laser beam and the second laser beam are different from each other based on types of films applied to the substrate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
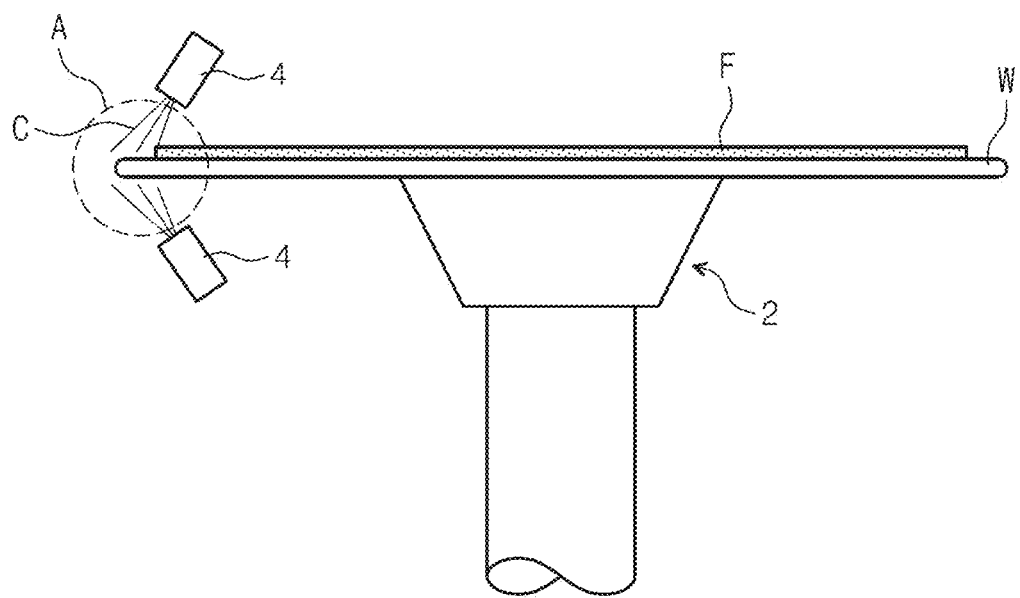
FIG. 1 is a view showing performing an edge bead removing process in a conventional substrate treating apparatus.

Hereinafter, embodiments of the inventive concept will be described in detail with reference to the accompanying drawings such that the embodiment is easily implemented by those of ordinary skill in the art. However, the inventive concept may be implemented in many different forms and is not limited to the embodiments described herein. Moreover, in detailed descriptions of a preferred embodiment of the inventive concept, when it is determined that detailed descriptions of related known functions or components may unnecessarily obscure gist of the inventive concept, the detailed descriptions thereof may be omitted. Moreover, the same reference numerals are used for parts having similar functions throughout the drawings.

The terminology used herein is for the purpose of describing particular embodiments only and is not intended to be limiting of the present disclosure. It will be further understood that the terms "comprises", "comprising", "includes", and "including" when used in this specification, specify the presence of the stated features, integers, operations, devices, and/or components, but do not preclude the presence or addition of one or more other features, integers, operations, devices, components, and/or portions thereof. As used herein, the term "and/or" includes any and all combinations of one or more of the associated listed items.

As used herein, the singular forms "a" and "an" are intended to include the plural forms as well, unless the context clearly indicates otherwise. For simplicity and clarity of illustration, devices in the figures are not necessarily drawn to scale.

Hereinafter, embodiments of the inventive concept will be described in detail with reference to FIG. 3 to FIG. 13.

Figure 3:
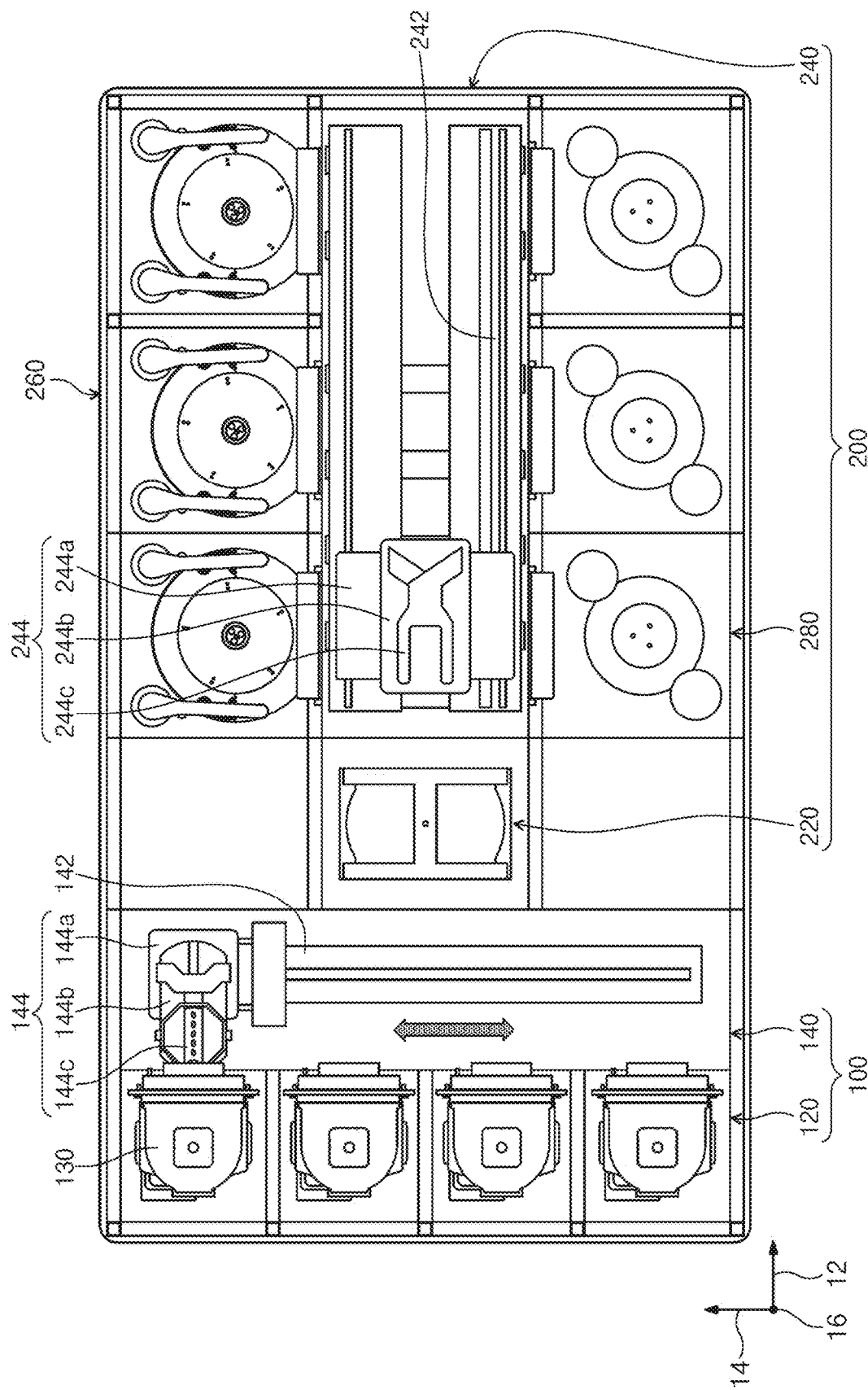
FIG. 3 is a plan view showing a substrate treating system according to an embodiment of the inventive concept.

FIG. 3 is a plan view showing a substrate treating system according to an embodiment of the inventive concept. Referring to FIG. 3, a substrate treating system 10 has an index module 100 and a process treating module 200. The index module 100 has a load port 120 and a transfer frame 140. The load port 120, the transfer frame 140, and the process treating module 200 are sequentially arranged in series. Hereinafter, a direction in which the load port 120, the transfer frame 140, and the process treating module 200 are arranged is referred to as a first direction 12. When viewed from above, a direction perpendicular to the first direction 12 is referred to as a second direction 14, and a direction perpendicular to a plane including the first direction 12 and the second direction 14 is referred to as a third direction 16.

A carrier 130 receiving a substrate W therein is seated on the load port 120. A plurality of load ports 120 are provided, which are arranged in a line along the second direction 14. The number of the load ports 120 may increase or decrease depending on process efficiency and a footprint condition of the process treating module 200. The carrier 130 has a plurality of slots (not shown) for receiving therein the substrates W in a horizontal orientation relative to a ground. The carrier 130 may employ a front opening unified pod (FOUP).

The process treating module 200 includes a buffer unit 220, a transfer chamber 240, a liquid treating chamber 260, and a laser treating chamber 280. The transfer chamber 240 has a length direction parallel to the first direction 12. The liquid treating chambers 260 and the laser treating chambers 280 are disposed on both sides of the transfer chamber 240, respectively. The liquid treating chambers 260 and the laser treating chambers 280 disposed on one side and the other side to the transfer chamber 240 respectively are arranged to be symmetrical with each other around the transfer chamber 240. A plurality of liquid treating chambers 260 are provided on one side to the transfer chamber 240. Some of the liquid treating chambers 260 are arranged along a length direction of the transfer chamber 240. Moreover, some of the liquid treating chambers 260 are stacked on top of each other. That is, on one side to the transfer chamber 240, the liquid treating chambers 260 may be arranged in a matrix of A×B. In this connection, A refers to the number of liquid treating chambers 260 arranged in a line along the first direction 12, while B refers to the number of liquid treating chambers 260 arranged in a line along the third direction 16. When four or six liquid treating chambers 260 are provided on one side to the transfer chamber 240, the liquid treating chambers 260 may be arranged in a matrix of 2×2 or 3×2. The number of liquid treating chambers 260 may be increased or decreased. In addition, the laser treating chambers 280 may be arranged on the other side to the transfer chamber 240 in a similar manner to the arrangement of the liquid treating chambers 260. Unlike the above arrangement, an arrangement of the liquid treating chambers 260 and an arrangement of the laser treating chambers 280 may be modified in various ways. For example, the liquid treating chambers 260 and the laser treating chambers 280 may be disposed on only one side to the transfer chamber 240. Moreover, the liquid treating chambers 260 and the laser treating chambers 280 may constitute respectively a single layer on one side and both sides to the transfer chamber 240.

The buffer unit 220 is disposed between the transfer frame 140 and the transfer chamber 240. The buffer unit 220 provides a space where the substrate W stays before the substrate W is transferred between the transfer chamber 240 and the transfer frame 140. The buffer unit 220 has a slot (not shown) defined therein into which substrate W is placed is disposed. Multiple slots (not shown) may be arranged to be spaced apart from each other along the third direction 16. The buffer unit 220 has an open face facing the transfer frame 140 and an open face facing the transfer chamber 240.

The transfer frame 140 transfers the substrate W between the carrier 130 seated on the load port 120 and the buffer unit 220. The transfer frame 140 has an index rail 142 and an index robot 144. The index rail 142 has a length direction parallel to the second direction 14. The index robot 144 is installed on the index rail 142, and linearly moves in the second direction 14 along the index rail 142. The index robot 144 has a base 144a, a body 144b, and an index arm 144c. The base 144a is configured to be movable along the index rail 142. The body 144b is coupled to the base 144a. The body 144b is configured to be movable along the third direction 16 and on the base 144a. Moreover, the body 144b is configured to be rotatable on the base 144a. The index arm 144c is coupled to the body 144b, and is configured to be movable forward and backward relative to the body 144b. A plurality of index arms 144c are configured to be individually driven. The index arms 144c are arranged to be space apart from each other along the third direction 16 in a stacked manner. Some of the index arms 144c may be used to transfer the substrate W from the process treating module 200 to the carrier 130. The others of the index arms 144c may be used for transferring the substrate W from the carrier 130 to the process treating module 200. This configuration may prevent particles generated from the substrate W before the process treating from being attached to the substrate W during the index robot 144 imports and exports the substrate W.

The transfer chamber 240 transfers the substrate W between the buffer unit 220 and the liquid treating chamber 260, between the buffer unit 220 and the laser treating chamber 280, between the liquid treating chambers 260, between the laser treating chambers 280, and between the liquid treating chamber 260 and the laser treating chamber 280. That is, the transfer chamber 240 acts as a transfer unit for transferring the substrate W. The transfer chamber 240 has a guide rail 242 and a main robot 244. The guide rail 242 has a length direction parallel to the first direction 12. The main robot 244 is installed on the guide rail 242, and linearly moves along the first direction 12 and on the guide rail 242. The main robot 244 has a base 244a, a body 244b, and a main arm 244c. The base 244a is configured to be movable along the guide rail 242. The body 244b is coupled to the base 244a. The body 244b is configured to be movable along the third direction 16 and on the base 244a. Moreover, the body 244b is configured to be rotatable on the base 244a. The main arm 244c is coupled to the body 244b, and is configured to move forward and backward relative to the body 244b. A plurality of main arms 244c are arranged to be individually driven. The main arms 244c are arranged to be spaced apart from each other along the third direction 16 in a stacked manner.

The liquid treating chamber 260 supplies treating liquid to the substrate W to perform a liquid treating process. The treating liquid may include chemical, rinse liquid, and organic solvent. The chemical may include an acid or base liquid. The chemical may include sulfuric acid ($H_2SO_4$), phosphoric acid ($P_2O_5$), HF (hydrofluoric acid), and ammonium hydroxide ($NH_4OH$). The chemical may include a DSP (Diluted Sulfuric acid Peroxide) mixed liquid. The rinse liquid may include pure water ($H_2O$). The organic solvent may include an isopropyl alcohol (IPA) liquid.

The liquid treating chamber 260 may perform a cleaning process. The substrate treating apparatuses respectively disposed in the liquid treating chambers 260 may have varying structures depending on types of cleaning processes to be performed therein. Alternatively, the substrate treating apparatuses disposed in the liquid treating chambers 260 respectively may have the same structure. Optionally, the liquid treating chambers 260 may be divided into a plurality of groups. In this connection, the substrate treating apparatuses respectively disposed in the liquid treating chambers 260 belonging to the same group may have the same structure. Structures of the substrate treating apparatuses respectively disposed in the liquid treating chambers 260 belonging to different groups may be different from each other. Moreover, the liquid treating chamber 260 may perform various processes such as photographing, ashing, and etching.

The laser treating chamber 280 may irradiate laser beams to the substrate W to perform a process of treating the substrate. Moreover, a substrate treating apparatus 300 may be disposed in the laser treating chamber 280. The substrate treating apparatus 300 may irradiate a laser beam onto the substrate W. The substrate treating apparatus 300 may irradiate the laser beam to an edge region of the substrate W. The Substrate treating apparatus 300 may perform a process of removing the film from the substrate W by irradiating the laser beam to the edge region of the substrate W.

Figure 4:
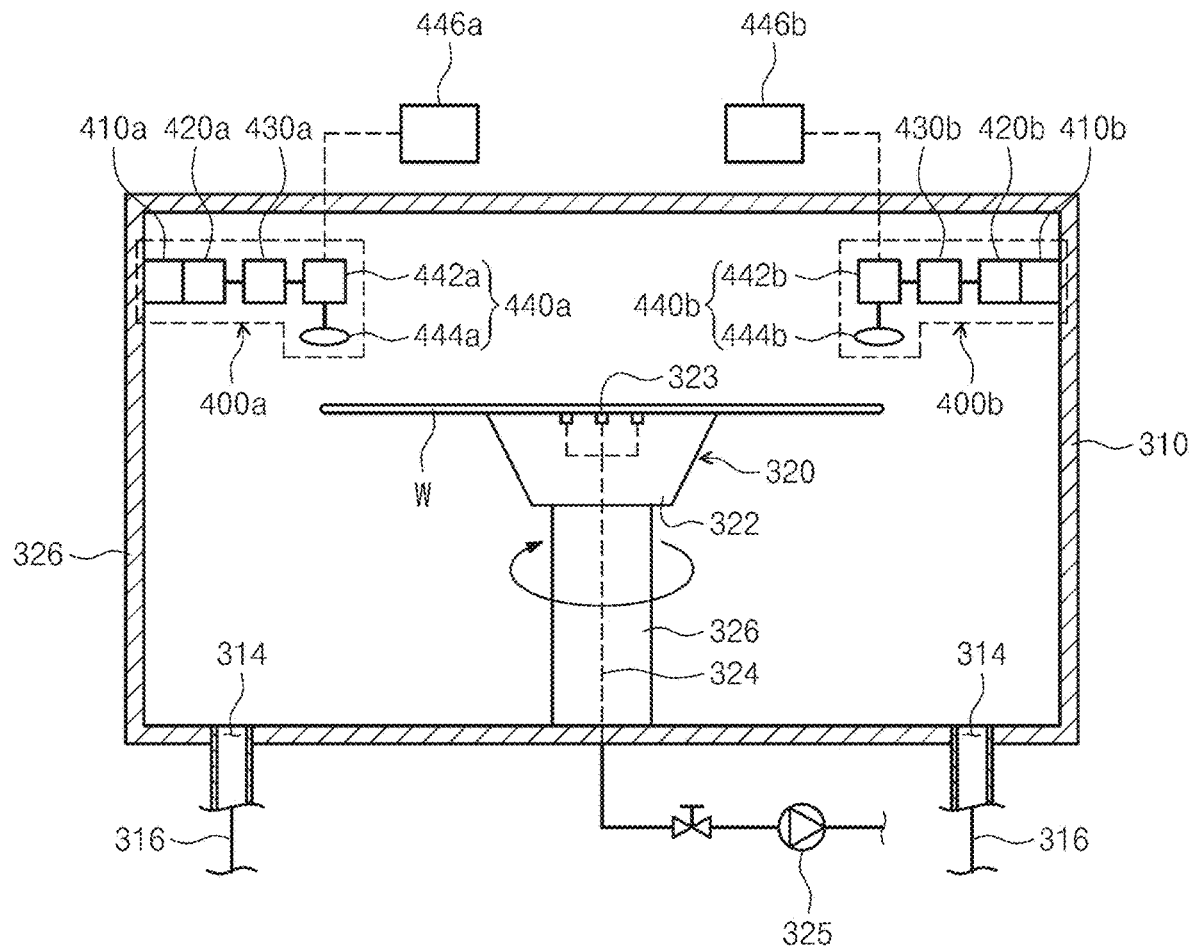
FIG. 4 is a cross-sectional view showing a substrate treating apparatus of FIG. 3.

Hereinafter, the substrate treating apparatus 300 disposed in the laser treating chamber 280 will be described in detail. FIG. 4 is a cross-sectional view showing the substrate treating apparatus of FIG. 3. Referring to FIG. 4, the substrate treating apparatus 300 may include a housing 310, a support unit 320, a first laser irradiation unit 400a, a second first laser irradiation unit 400ab, and a controller (not shown).

The housing 310 has an inner space 312 defined therein. The inner space 312 may act as a space where the substrate W is processed. An opening (not shown) is defined in one side portion to the housing 310. The opening functions as an entrance through which the substrate W enters or exits the inner space of the housing 310. A door (not shown) is installed at the opening. The door opens and closes the opening. When the substrate treating process is in progress, the door closes the opening to seal the inner space 312 of the housing 310. An exhaust port 314 is formed on a bottom surface of the housing 310. The exhaust port 314 is connected to an exhaust line 316. Accordingly, by-products generated as the substrate W is processed in the inner space 312 may be exhausted out of the substrate treating apparatus 300. Moreover, a gas supply line (not shown) for supplying gas to the inner space 312 may be connected to the housing 310. The gas may be an inert gas such as nitrogen. The gas supplied via the gas supply line may generate air flow in the inner space 312. The air flow generated in the inner space 312 enables more efficient evacuation of the byproducts generated as the substrate W is processed.

The support unit 320 supports and rotates the substrate W. The support unit 320 may include a support plate 322 and a rotatable shaft 326. The support plate 322 supports the substrate W. The support plate 322 is configured to have a circular plate shape. The support plate 322 may be constructed such that a diameter of a top surface thereof is larger than a diameter of a bottom surface thereof. A side surface connecting the top surface and the bottom surface of the support plate 322 to each other may be downwardly and inwardly inclined. The top surface of the support plate 322 act as a seat surface on which the substrate W rests. The seat surface has a smaller area than that of the substrate W. According to one example, a diameter of the seat surface may be smaller than a radius of the substrate W. The seat surface supports a central region of the substrate W. A plurality of suctioning holes 323 are defined in the seat surface. The suctioning holes 323 may act to suction the substrate W placed on the seat surface while the suctioning holes 323 are depressurized. To this end, a vacuum member 325 is connected to the suctioning holes 323. The vacuum member 325 may be embodied as a pump that depressurizes the suctioning holes 323. However, the vacuum member 325 is not limited to the pump, and may be variously modified to a known apparatus that depressurizes the suctioning holes 323.

The rotatable shaft 326 is configured to have a tubular shape extending vertically. The rotatable shaft 326 is joined to a bottom surface of the support plate 322. An actuator (not shown) transmits a rotational force to the rotatable shaft 326. The rotatable shaft 326 is rotatable about a central axis using the rotational force provided from the actuator. The support plate 322 is rotatable together with rotation of a rotatable shaft 326. A rotation speed of the rotatable shaft 326 is controlled by a driver, so that a rotation speed of the substrate W is adjusted in a corresponding manner. For example, the driver may be embodied as a motor. However, the driver is not limited to the motor, and may be variously modified to a known apparatus that applies the rotational force to the rotatable shaft 326.

The first laser irradiation unit 400a may irradiate a first laser beam L1 onto the substrate W supported on the support unit 320. Hereinafter, a wavelength of the first laser beam L1 is defined as a first wavelength. The first laser irradiation unit 400a may irradiate a plurality of unit pulse laser beams L1 on the substrate W supported on the support unit 320. The first laser irradiation unit 400a may irradiate the first laser beam L1 to the edge region of the substrate W. The first laser irradiation unit 400a may irradiate the first laser beam L1 to remove the film disposed on the edge region of the substrate W. The first laser irradiation unit 400a may include a first laser light source 410a, a first wavelength adjusting member 420a, a first shape adjusting member 430a, and a first laser irradiation member 440a.

The first laser light source 410a may irradiate the first laser beam L. The first laser light source 410a may be embodied as a source of the first laser beam L1 irradiated to the substrate W. The first laser light source 410a may irradiate the first laser beam L1 in a plurality of unit pulse laser beams manner.

The first wavelength adjusting member 420a may change the first wavelength of the first laser beam L1 coming from the first laser light source 410a. For example, the first wavelength adjusting member 420a may be embodied as an optical device that changes the first wavelength of the first laser beam L. The first wavelength adjusting member 420a may change the first wavelength of the first laser beam L1 so that the first laser beam L1 has a wavelength ranging from 150 nm to 1200 nm. This is because when the first laser beam L1 has a wavelength of 150 nm or smaller, not only the film on the substrate W but also the substrate W are etched away, whereas when the first laser beam L1 has a wavelength of 1200 nm or greater, the film on the substrate W is not removed. Moreover, the first wavelength adjusting member 420a may adjust the first wavelength of the first laser beam L1 so that the first laser beam L1 has a wide range of wavelengths. For example, the first wavelength adjusting member 420a may change the first wavelength of the first laser beam L1 such that the first laser beam L1 has a wavelength in one range selected from a first range of 750 nm to 1200 nm, a second range of 380 nm to 749 nm, a third range of 300 nm to 379 nm, and a fourth range of 150 nm to 299 nm. That is, the first wavelength of the first laser beam L1 may be present in one range selected from the first to fourth ranges.

The first shape adjusting member 430a may change a shape of the first laser beam L1 irradiated from the first laser light source 410a. For example, the first shape adjusting member 430a may allow the first laser beam L1 irradiated from the first laser light source 410a to have a circular shape. Moreover, the first shape adjusting member 430a may allow the first laser beam L1 irradiated from the first laser light source 410a to have a quadrangular shape. The quadrangular shape may have a square shape or a rectangular shape. Moreover, the first shape adjusting member 430a may allow the first laser beam L1 irradiated from the first laser light source 410a to have a quadrangular shape having a round corner.

The first laser irradiation member 440a may irradiate the first laser beam L1 to the substrate W supported on the support unit 320. For example, the first laser beam L1 irradiated from the first laser light source 410a passes through the first wavelength adjusting member 420a and the first shape adjusting member 430a. Thus, the first wavelength adjusting member 420a and the first shape adjusting member 430a may adjust the wavelength and the shape thereof. Then, the first laser beam L1 having the varied shape and wavelength may be transferred to the first laser irradiation member 440a. The first laser irradiation member 440a may include a first scanner 442a, a first lens 444a, and a first driving member 446a. The first scanner 442a may change an irradiation direction of the first laser beam L1 passing through the first wavelength adjusting member 420a and the first shape adjusting member 430a. The first lens 444a allows the first laser beam L1 passing through the first scanner 442a to be concentrated onto the substrate W. The first driving member 446a may move the first scanner 442a and/or the first lens 444a. The first driving member 446a may transmit a driving force for moving the first scanner 442a and/or the first lens 444a. The first driving member 446a may move the first scanner 442a and/or the first lens 444a in a horizontal or a vertical direction. Thus, the first driving member 446a may allow the plurality of unit pulse laser beams L1 to be irradiated to the edge region of the substrate W. Moreover, the first driving member 446a may allow a target region of the substrate W receiving the plurality of unit pulse laser beams L1 to move along a radial direction of the substrate W.

A configuration and a function of the second laser irradiation unit 400b are the same as or similar to those of the first laser irradiation unit 400a. Therefore, descriptions of the second laser irradiation unit 400b will be mainly related to differences between the second laser irradiation unit 400b and the first laser irradiation unit 400a. Overlapping descriptions therebetween will be omitted.

The second laser irradiation unit 400b may irradiate a second laser beam L2 having a second wavelength to the substrate W supported on the support unit 320. Hereinafter, a wavelength of the second laser beam L2 is defined as the second wavelength. The second wavelength may be different from the first wavelength of the first laser beam L1. Moreover, the second laser irradiation unit 400b and the first laser irradiation unit 400a may irradiate the first and second laser beams L1 and L2 respectively while being spaced apart from each other. In one example, a second laser irradiation member 440b included in the second laser irradiation unit 400b and the first laser irradiation member 400a included in the first laser irradiation unit 400a may irradiate the first and second laser beams L1 and L2 respectively while being spaced apart from each other.

The controller (not shown) may control the substrate treating system 10. For example, the controller may control the transfer of the substrate W between the liquid treating chambers 260, between the laser treating chambers 280, and between the liquid treating chambers 260 and the laser treating chambers 280. In addition, the controller may control the substrate treating apparatus 300. The controller may control the substrate treating apparatus 300 to perform the film removing method or the substrate treating method as described below.

Further, the controller may control the first laser irradiation unit 400a and the second laser irradiation unit 400b. For example, the controller may control the first laser irradiation unit 400a and the second laser irradiation unit 400b to vary the first wavelength of the first laser beam L1 and the second wavelength of the second laser beam L2 respectively. As described above, the first wavelength may be present in one wavelength range selected from the first range of 750 nm to 1200 nm, the second range of 380 nm to 749 nm, the third range of 300 nm to 379 nm, and the fourth range of 150 nm to 299 nm. Moreover, the second wavelength is different from the first wavelength. Moreover, the second wavelength may be present in another wavelength range selected from the first range of 750 nm to 1200 nm, the second range of 380 nm to 749 nm, the third range of 300 nm to 379 nm, and the fourth range of 150 nm to 299 nm. That is, the controller may control the first laser irradiation unit 400a and the second laser irradiation unit 400b such that the number of combinations of the first wavelength and the second wavelength is 4×3.

Hereinafter, a method for treating a substrate according to one embodiment of the inventive concept will be described in detail. The method for treating the substrate may include a method for removing the film on the substrate W by irradiating a plurality of laser beams onto the edge region of the substrate W. The film on the substrate W may be a film formed using a deposition process. For example, the film on the substrate W may be made of TiN, SiN, tungsten, oxide, or the like. However, the substrate treating method according to one embodiment of the inventive concept is not limited to the method for removing the film, and may be equally applied to various treating methods for treating the substrate by irradiating the laser onto the substrate W.

Figure 5:
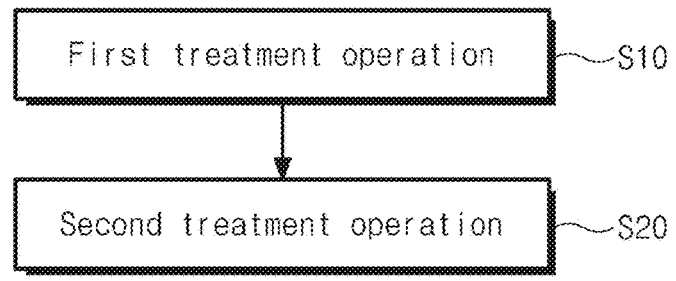
FIG. 5 is a flow chart showing a substrate treating method according to one embodiment of the inventive concept.

FIG. 5 is a flow chart showing a substrate treating method according to one embodiment of the inventive concept. Referring to FIG. 5, the substrate treating method may include a first treatment operation S10 and a second treatment operation S20. The first treatment operation S10 and the second treatment operation S20 may be performed sequentially. For example, the second treatment operation S20 may be performed after the first treatment operation S10 is completed. In the first treating operation S10, the first laser beam L1 of the first wavelength is irradiated to the edge region of the substrate W. In the second treating operation S20, the second laser beam L2 of the second wavelength is irradiated to the edge region of the substrate W. As described above, the first laser beam L1 may irradiated from the first laser irradiation unit 400a. Moreover, the second laser beam L2 may be irradiated from the second laser irradiation unit 400b.

In the first treatment operation S10 and the second treatment operation S20, the plurality of unit pulse laser beams may be irradiated to the edge region of the substrate W to remove the film from the substrate W. The plurality of unit pulse laser beams may be embodied as a plurality of ultra-short pulsed laser beams. For example, a unit pulse laser beam of the plurality of unit pulse laser beams may have a pulse width of several tens of ns to hundreds of fs. When the plurality of ultra-short pulsed laser beams are irradiated to the film on the substrate W in a non-thermal contactless manner, an immediate ablation phenomenon may occur in the film. Thus, it is possible to remove an unnecessary portion of the film from the edge region of the substrate W.

Figure 6:
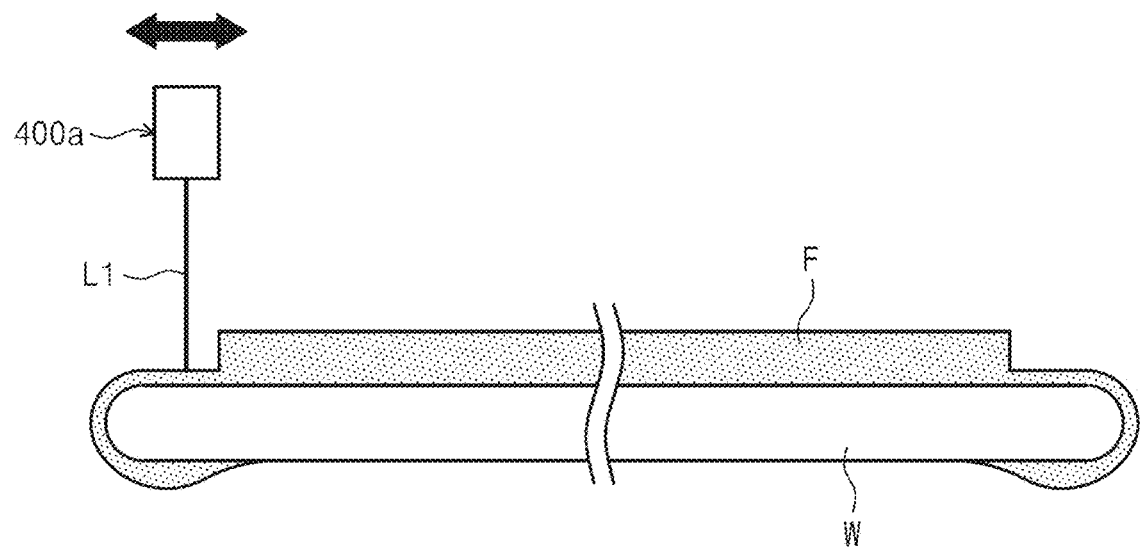
FIG. 6 is a view showing an example in which a laser irradiation unit irradiates a laser beam to a substrate in a first treatment operation of FIG. 5.
Figure 7:
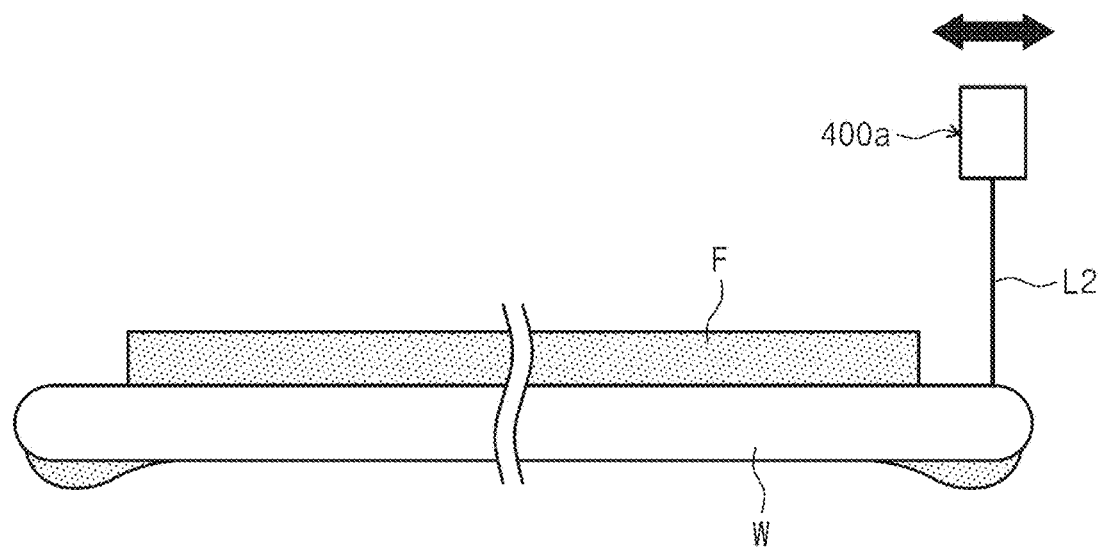
FIG. 7 is a view showing an example in which a laser irradiation unit irradiates a laser beam to a substrate in a second treating operation of FIG. 5.

Moreover, in the first treatment operation S10, irradiation of the first laser beam L1 as the unit pulse laser beam may be performed along the circumferential direction of the substrate W via rotation of the substrate W, as shown in FIG. 6. Moreover, in the first treatment operation S10, an irradiation position of the first laser beam L1 as the unit pulse laser beam may be displaced along the radial direction of the substrate W. Accordingly, it is possible to expand or reduce the edge region where the film F is removed from the substrate W. Moreover, in the second treating operation S20, as shown in FIG. 7, irradiation of the second laser beam L2 may be performed in a similar manner to that in the first treating operation S10.

Figure 8:
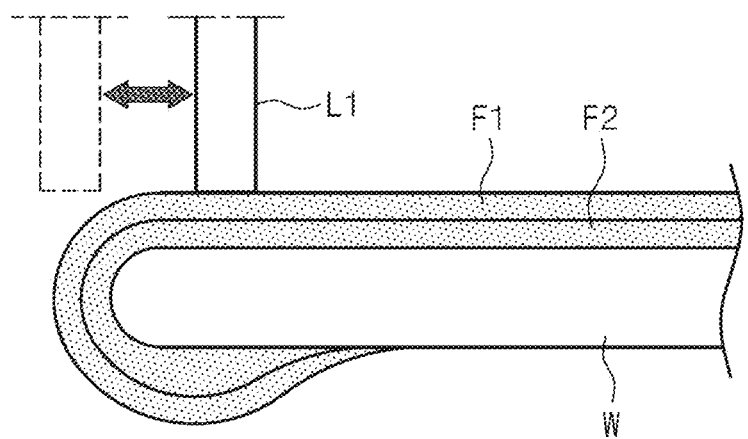
FIG. 8 is an enlarged view showing an edge region of a substrate subjected to a first treating operation of FIG. 5.
Figure 9:
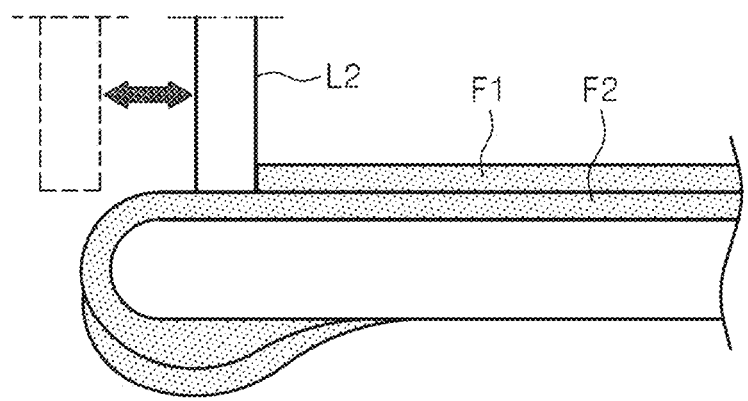
FIG. 9 is an enlarged view showing an edge region of a substrate subjected to a second treating operation of FIG. 5.
Figure 10:
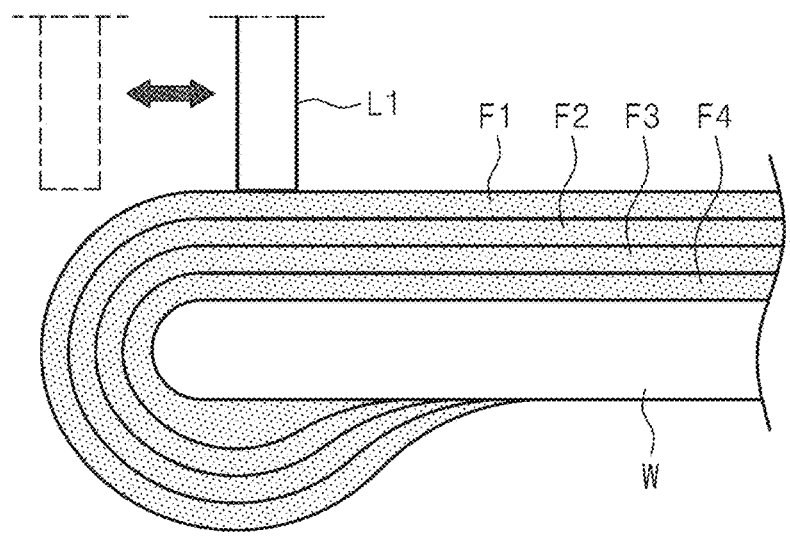
FIG. 10 to FIG. 13 are views showing another example of removing a film from a substrate.
Figure 11:
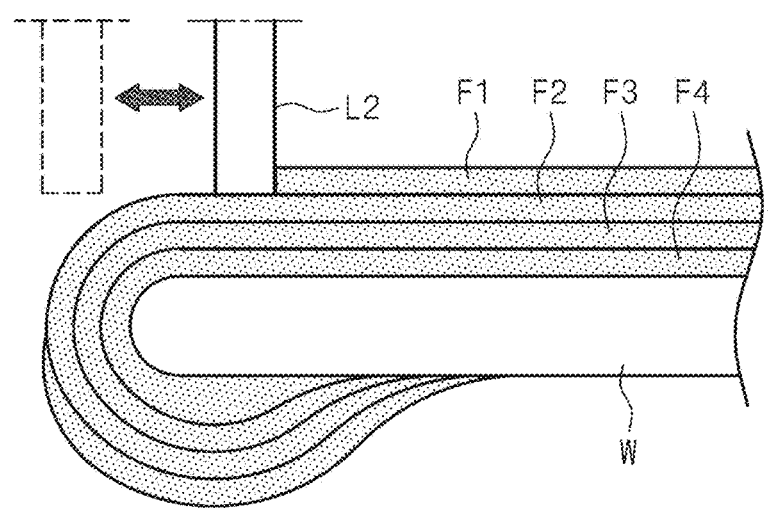
Figure 12:
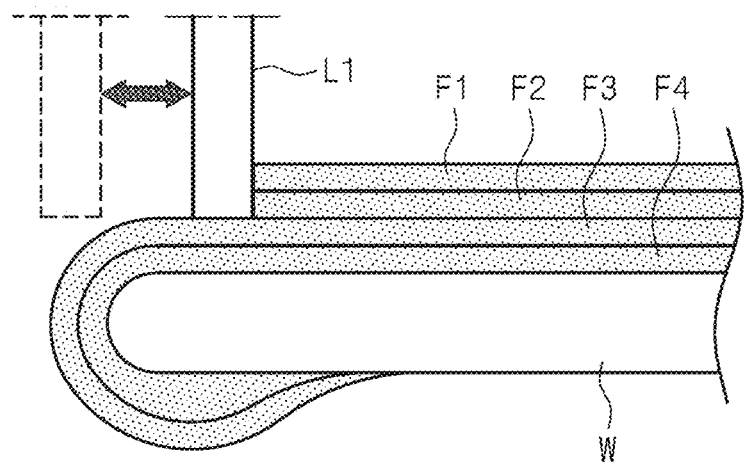
Figure 13:
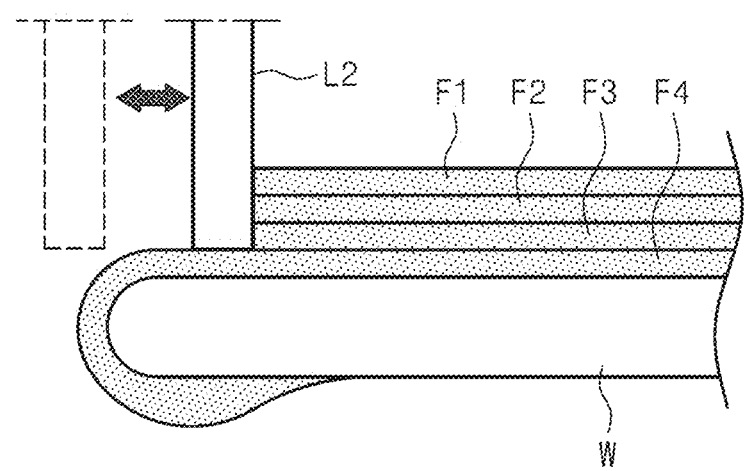

FIG. 8 is an enlarged view showing the edge region of the substrate subjected to the first treatment operation of FIG. 5. FIG. 9 is an enlarged view showing the edge region of the substrate subjected to the second treatment operation of FIG. 5.

Referring to FIG. 8 and FIG. 9, the film F on the substrate W may include a first film F1 and a second film F2. The first film F1 and the second film F2 may be different from each other. Moreover, the first film F1 and the second film F2 may be vertically sequentially stacked on the substrate W.

According to one embodiment of the inventive concept, when removing the first film F1, the first treating operation S10 may be performed. That is, when removing the first film F1, the first laser beam L1 having the first wavelength may be irradiated to the edge region of the substrate W. Moreover, the irradiation position of the first laser beam L1 may be displaced along the radial direction of the substrate W during the first treating operation S10. Moreover, when removing the second film F2, the second treating operation S20 may be performed. That is, when removing the second film F2, the second laser beam L2 having the second wavelength may be irradiated to the edge region of the substrate W. Moreover, the irradiation position of the second laser beam L2 may be displaced along the radial direction of the substrate W during the second treating operation S20.

Figure 2:
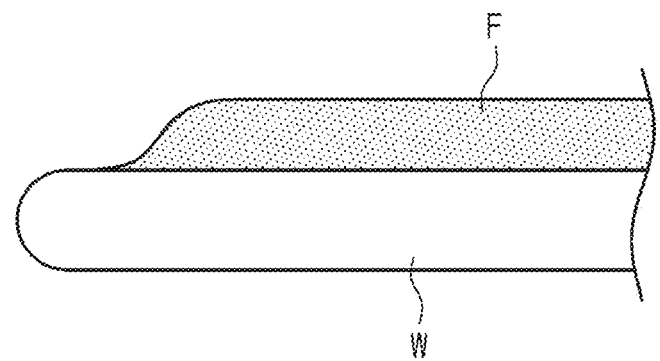
FIG. 2 is an enlarged view showing a 'A' region of FIG. 1.

Conventionally, when spraying chemical such as etching liquid to the edge region of the substrate to remove the film, the film removal is not properly achieved. For example, the film on the substrate may be removed obliquely downwardly and inwardly along the radial direction of the substrate as shown in FIG. 2. This is due to non-uniform selectivity of the chemical used for removing the film. When the film is not properly removed, a production yield of a semiconductor device is reduced. Moreover, a pin mark, etc., is formed on a substrate surface to cause additional contamination. However, according to an embodiment of the inventive concept, the plurality of unit pulse laser beams are irradiated onto the substrate W to remove the film from the substrate W. Accordingly, the immediate ablation of the film on the substrate W occurs, such that the film is removed at uniform and high selectivity. Moreover, according to one embodiment of the inventive concept, the film on the substrate W is removed using the plurality of the unit pulse laser beams, a shape and/or a position of the region where the film is removed from the substrate W may vary. Moreover, the region where the film is removed from the substrate W may be minimized. The approach in which the shape and/or the position of the region where the film is removed from the substrate W varies and the region where the film is removed from the substrate W is minimized may satisfy recent requirements in a semiconductor device manufacturing process.

Moreover, various types of films F may be formed on the substrate W. For example, each of the films F may be made of TiN, SiN, tungsten, oxide, or the like. The various types of films may be vertically and sequentially stacked on the substrate W. According to one embodiment of the inventive concept, the various types of films may be removed using various unit pulse laser beams having different wavelengths based on the types of the films respectively. For example, when removing the first film F1, the first laser beam L1 of the first wavelength may be irradiated. When removing the second film F2, the second laser beam L2 of the second wavelength may be irradiated. Thus, it is possible to maximize efficiency in removing each of the films.

Moreover, according to one embodiment of the inventive concept, the first wavelength of the first laser beam L1 may be present in one wavelength range selected from the above-described first range, second range, third range, and fourth range. Moreover, the second wavelength of the second laser beam L2 may be present in another wavelength range selected from the first range, the second range, the third range, and the fourth range. IN this connection, the first wavelength and the second wavelength may be different from each other. That is, in performing the first treating operation S10 and the second treating operation S20, the number of the combinations of the first and second wavelengths may be 12 (3×4).

In the above example, the film on the substrate W includes the first film F1 and the second film F2. The first laser beam L1 is irradiated when removing the first film F1. The second laser beam L2 is irradiated when removing the second film F2. This is merely one example. Thus, the inventive concept is not limited thereto. FIG. 10 to FIG. 13 are views showing another example of removing the film on the substrate. Referring to FIG. 10 to FIG. 13, the film on the substrate W may include a first film F1, a second film F2, a third film F3, and a fourth film F4. The first film F1, the second film F2, the third film F3, and the fourth film F4 are vertically and sequentially stacked on the substrate and are different from each other in terms of materials thereof. When removing the first film F1, the first laser irradiation unit 400a may irradiate the first laser beam L1 to remove the first film F1. When removing the second film F2, the second laser irradiation unit 400b may irradiate the second laser beam L2 to remove the second film F2. When removing the third film F3, the first laser irradiation unit 400a may irradiate the first laser beam L1 to remove the third film F3. In this connection, the wavelength of the first laser beam L1 when removing the third film F3 may be different from the wavelength of the first laser beam L1 when removing the first film F1. When removing the fourth film F4, the second laser irradiation unit 400b may irradiate the second laser beam L2 to remove the fourth film F4. In this connection, the wavelength of the second laser beam L2 when removing the fourth film F4 may be different from the wavelength of the second laser beam L2 when removing the second film F2.

Figure 14:
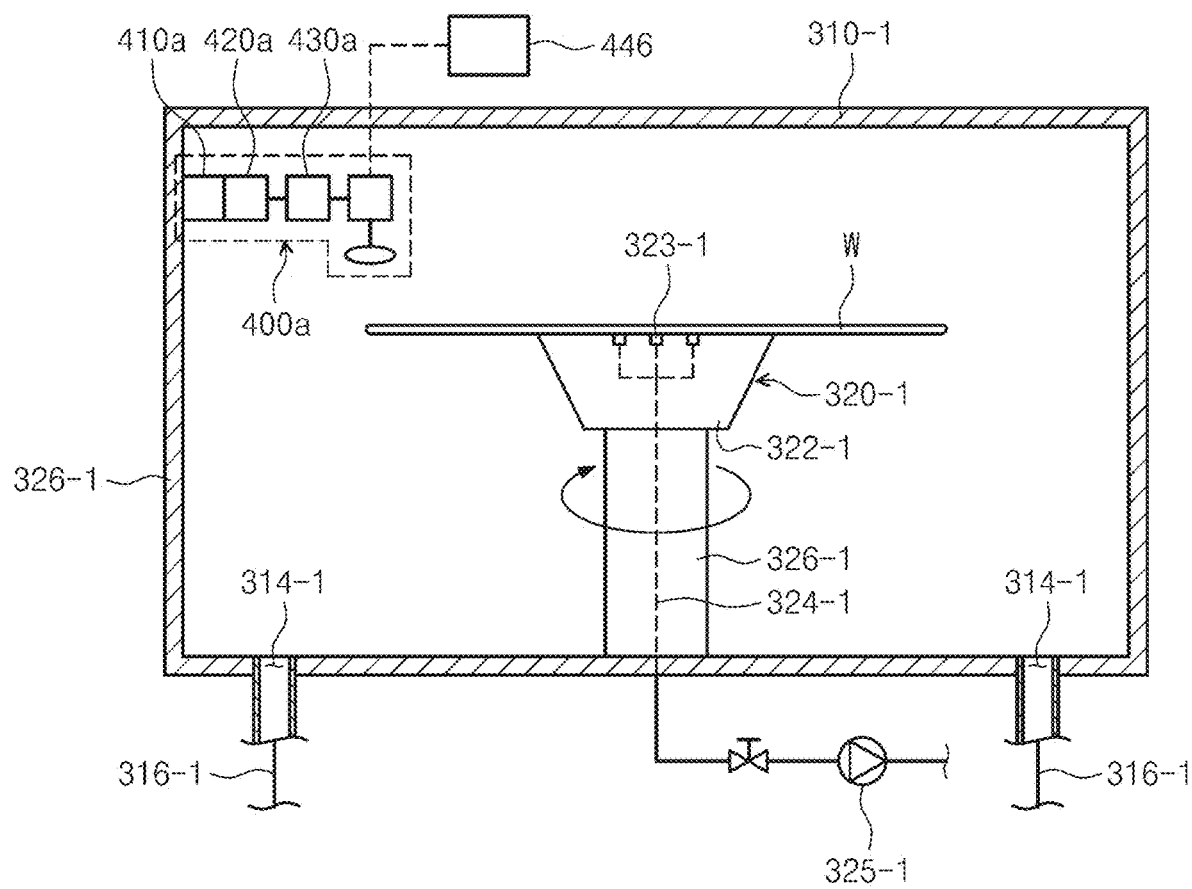
FIG. 14 and FIG. 15 are views showing a substrate treating apparatus according to another embodiment of the inventive concept.
Figure 15:
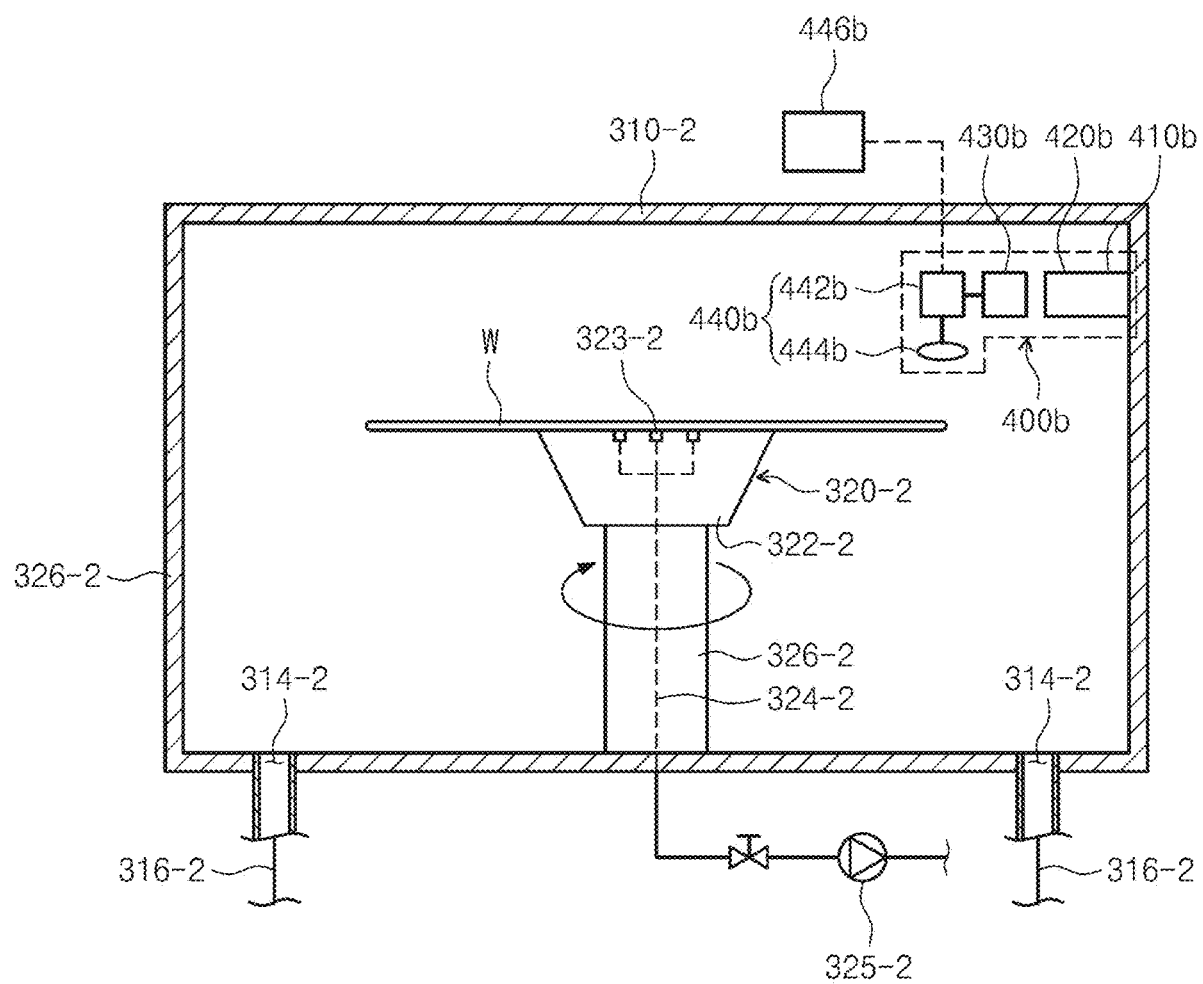

In the above example, the first treating operation S10 and the second treating operation S20 are performed in the same chamber. However, the inventive concept is not limited thereto. The first treating operation S10 and the second treating operation S20 may be performed in different chambers. FIG. 14 and FIG. 15 are views showing a substrate treating apparatus according to another embodiment of the inventive concept. Referring to FIG. 14 and FIG. 15, the laser treating chamber 280 may include a first chamber, and a second chamber disposed independently of the first chamber. FIG. 14 is a view showing a first substrate treating apparatus 300-1 disposed in the first chamber. FIG. 15 is a view showing a second substrate treating apparatus 300-2 disposed in the second chamber. The first laser irradiation unit 400a may be disposed in a first inner space 312-1 of the first chamber. Moreover, the second laser irradiation unit 400b may be disposed in a second inner space 312-2 of the second chamber. Moreover, the controller may control a substrate treating system 10 so that the first treating operation S10, the transfer operation, and the second treating operation S20 are sequentially performed. The first treating operation S10 includes irradiating the first laser beam L1 onto the substrate W received in the first inner space 312-1. The transfer operation includes transferring the substrate W subjected to the first treating operation S10 from the first inner space 312-1 to the second inner space 312-2. The second treating operation S20 includes irradiating the second laser beam L2 onto the substrate W transferred to the second inner space 312-2.

In the above-described example, the film is removed by irradiating a plurality of unit pulse laser beams on a top surface of the substrate W. However, the inventive concept is not limited thereto. For example, the first laser beam L1 and the second laser beam L2 may be irradiated to a bottom surface of the edge region of substrate W. In this case, each of the first laser irradiation unit 400a and the second laser irradiation unit 400b may further include a scanner and a lens disposed under the substrate W.

According to one embodiment of the inventive concept, the film removing efficiency may be maximized.

Furthermore, according to one embodiment of the inventive concept, the plurality of unit pulse laser beams may be irradiated to the film on the substrate to increase the film removal efficiency.

Moreover, according to one embodiment of the inventive concept, an area of the film removed region may be minimized and a shape and/or a location of the film removed region may be variously changed.

Moreover, according to one embodiment of the inventive concept, a wavelength of a laser beam to be irradiated is varied depending on a type of a film to maximize efficiency of film removal.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
   a chamber defining an inner space;
   a support unit received in the inner space and configured to support and rotate the substrate;
   a first laser irradiation unit configured to perform an edge bead removal (EBR) process by firing a first laser beam having a first wavelength to remove an exposed upper first layer of an organic film on an upper surface of the substrate that is supported on the support unit; and
   a second laser irradiation unit configured to perform the EBR process by firing a second laser beam having a second wavelength, different than the first wavelength, to remove a second layer of the organic film on the upper surface of the substrate that is supported on the support unit,
   wherein the first and second wavelengths are between 150 nm and 380 nm.

2. The apparatus of claim 1, wherein the first laser irradiation unit and the second laser irradiation unit are configured so that each of the first laser beam and the second laser beam includes a plurality of pulsed laser beams.

3. The apparatus of claim 1, further comprising:
   an exhaust line connected to the chamber, the exhaust line configured to exhaust byproducts during the EBR process.

4. The apparatus of claim 1, further comprising:
   a vacuum member connected to the support unit, the vacuum member configured to apply suction to a bottom surface of the substrate.

5. The apparatus of claim 1, wherein an upper seat surface of the support unit has a larger diameter than the substrate.

6. The apparatus of claim 1, wherein
   the support unit includes a support plate,
   an upper surface of the support plate has a plurality of suction holes, and
   the support plate is tapered such that a diameter of the upper surface of the support plate is greater than a diameter of a bottom of the support plate.

7. The apparatus of claim 1, wherein an area of a seat surface of the support unit is less than an area of the substrate.

8. An apparatus for treating a substrate, the apparatus comprising:
   a chamber defining an inner space;
   a pedestal received in the inner space and configured to support the substrate;

a first laser irradiation unit configured to perform an edge bead removal (EBR) process by firing a first laser beam having a first wavelength to remove an exposed upper first layer of an organic film on an upper surface of the substrate that is supported on the pedestal; and a second laser irradiation unit configured to perform the EBR process by firing a second laser beam having a second wavelength, different than the first wavelength, to remove a second layer of the organic film on the upper surface of the substrate that is supported on the pedestal, wherein the first wavelength and the second wavelength are selected from among four wavelength ranges, a wavelength range of the first wavelength different from a wavelength range of the second wavelength, and the four wavelength ranges include a first range of 750 nm to 1200 nm, a second range of 380 nm to 749 nm, a third range of 300 nm to 379 nm, and a fourth range of 150 nm to 299 nm.

9. The apparatus of claim 1, wherein a diameter of a top surface of a support plate of the support unit is less than a diameter of a bottom surface of the support plate.

10. The apparatus of claim 8, wherein an area of a seat surface of the pedestal is less than an area of the substrate.

11. The apparatus of claim 8, wherein the first laser irradiation unit and the second laser irradiation unit are configured so that each of the first laser beam and the second laser beam includes a plurality of pulsed laser beams.

12. The apparatus of claim 8, further comprising:
an exhaust line connected to the chamber, the exhaust line configured to exhaust byproducts during the EBR process.

13. The apparatus of claim 8, further comprising:
a pump connected to the pedestal, the pump configured to apply suction to a bottom surface of the substrate.

14. The apparatus of claim 1, wherein a diameter of a top surface of a support plate of the support unit is less than a diameter of a bottom surface of the support plate.

* * * * *